(12) United States Patent
Anand

(10) Patent No.: US 7,920,003 B1
(45) Date of Patent: Apr. 5, 2011

(54) DELAY CIRCUIT WITH DELAY EQUAL TO PERCENTAGE OF INPUT PULSE WIDTH

(75) Inventor: Darren L. Anand, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 14 days.

(21) Appl. No.: 12/560,593

(22) Filed: Sep. 16, 2009

(51) Int. Cl.
*H03K 3/017* (2006.01)

(52) U.S. Cl. .......................................... 327/175; 327/172

(58) Field of Classification Search .................. None
See application file for complete search history.

(56) References Cited

U.S. PATENT DOCUMENTS

| | | | |
|---|---|---|---|
| 3,883,756 A | 5/1975 | Dragon | |
| 6,504,409 B1 | 1/2003 | Laletin | |
| 6,664,834 B2 * | 12/2003 | Nair et al. | 327/175 |
| 6,943,604 B2 | 9/2005 | Minzoni | |
| 7,061,304 B2 | 6/2006 | Anand et al. | |
| 7,330,061 B2 * | 2/2008 | Boerstler et al. | 327/175 |
| 7,420,400 B2 | 9/2008 | Boerstler et al. | |

* cited by examiner

*Primary Examiner* — An T Luu
(74) *Attorney, Agent, or Firm* — David A. Cain; Hoffman Warnick LLC

(57) ABSTRACT

A delay circuit with a delay equal to the percentage of the input pulse width is described. In one embodiment, the ratio of the discharge current to the charge-up current of a timing capacitor is used to determine the percentage of the input pulse width used for the output delay. In a first timing phase, the input pulse width is stored as a voltage on the timing capacitor. In a second timing phase, the output is delayed by a percentage of the input pulse width. In a third timing phase, the circuit is restored to the trip point to remove sensitivity to process variation or applied conditions variation such as voltage or temperature (P-V-T variation), and be ready for the next timing cycle.

20 Claims, 7 Drawing Sheets

DELAY CIRCUIT WITH DELAY EQUAL TO PERCENTAGE OF INPUT PULSE WIDTH

BACKGROUND

The present invention relates generally to the timing of integrated circuit designs, and more specifically to a delay circuit that generates a delay equal to a percentage of an input pulse width.

In semiconductor circuit design, it is desirable to generate different timing in circuits in order to control operations of an integrated circuit chip. For example, it may be desirable to generate a timing that occurs at a specific phase of a clock cycle or that is related to the delay of another circuit timing. Some circuit designs generate timings by using simple delays that buffer signals to generate a delay. These simple delay techniques have a lot of sensitivities and variations to Process, Voltage and Temperature (P-V-T) conditions that a circuit design may experience. However, these techniques do not track to a reference delay or cycle, so are not useful for placing timings at a specific percentage of a reference time. Another delay technique that solves this issue is to create a delay that tracks to a reference clock by using a delay-locked-loop (DLL) device or a phase-locked-loop (PLL) device. In such approaches, a delay chain or ring oscillator is controlled by a DLL device or a PLL device and varied until there is a total delay that matches the reference clock. As an example, it may be desirable to generate a signal that is at 270 degrees of the reference clock. A DLL device or PLL device can be used to lock to the reference clock and then produce an output at the desired phase of the cycle. This is typically accomplished in a DLL device by having multiple output points along the delay line that represent different percentages of the total cycle time. Timing circuits that employ a DLL device or a PLL device are typically very complex, require many clock cycles to lock, and occupy a large amount of space on an integrated circuit chip, increasing cost.

SUMMARY

In one embodiment, there is a circuit that comprises a timing capacitor. A pull-down current source is configured to generate a discharge current that discharges the timing capacitor. A pull-up current source is configured to generate a charge-up current that charges up the timing capacitor. A clock is configured to generate an input pulse having a first duty cycle that controls generation of the discharge current by the pull-down current source, generation of the charge-up current by the pull-up current source and precharge of the timing capacitor to a restore state. An output stage, coupled to the timing capacitor, is configured to generate an output pulse with a second duty cycle that is an adjustable percentage of the first duty cycle of the input pulse generated by the clock, wherein the second duty cycle is a function of the ratio of the discharge current to the charge-up current.

In a second embodiment, there is a delay circuit that comprises a timing capacitor. A pull-down current source is configured to generate a discharge current that discharges up the timing capacitor. A pull-up current source is configured to generate a charge-up current that charges up the timing capacitor. A bias generator is configured to generate a current that is supplied to the pull-down current source and the pull-up current source. A clock is configured to generate an input pulse having a first duty cycle that controls generation of the discharge current by the pull-down current source to discharge the timing capacitor, generation of the charge-up current by the pull-up current source to charge-up the timing capacitor and precharge of the timing capacitor to a restore state. An output stage, coupled to the timing capacitor, is configured to generate an output pulse with a second duty cycle that is an adjustable percentage of the first duty cycle of the input pulse generated by the clock, wherein the second duty cycle is a function of the ratio of the discharge current to the charge-up current.

In a third embodiment, there is a method for generating a clock signal. In this embodiment, the method comprises: generating an input pulse having a first duty cycle; generating a discharge current that discharges a timing capacitor as the input pulse goes into one logic state; generating a charge-up current that charges up the timing capacitor as the input pulse goes from the one logic state to the next logic state; precharging the timing capacitor to a restore state for the next cycle of the input pulse; and generating an output pulse in accordance with the input pulse as the timing capacitor discharges, charges-up and precharges, wherein the output pulse has a second duty cycle that is a percentage of the first duty cycle of the input pulse, wherein the second duty cycle is a function of the ratio of the discharge current to the charge-up current.

DETAILED DESCRIPTION

Figure 1:
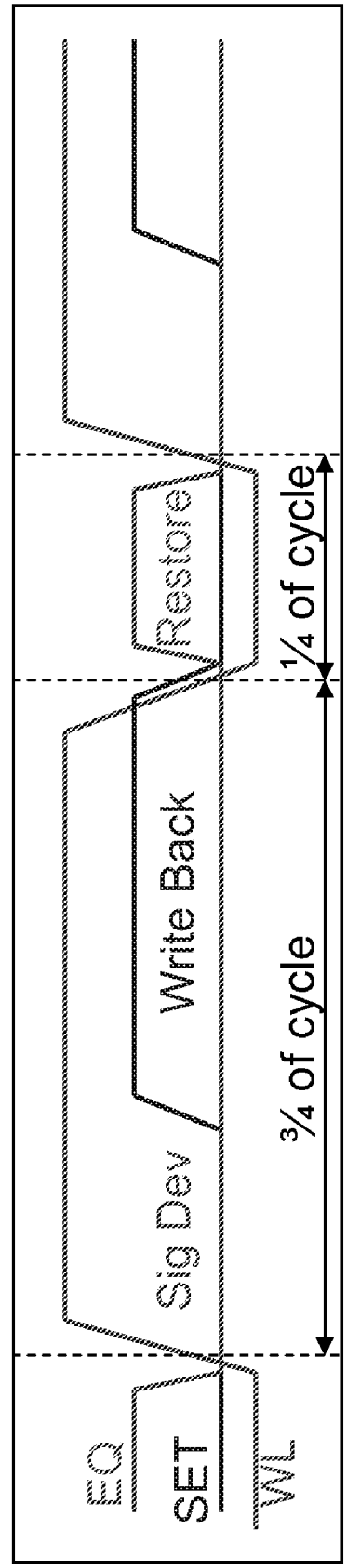
FIG. 1 shows an example of one timing diagram used to control timing of a word line used with a storage cell in a dynamic random access memory (DRAM) array of storage cells according to one embodiment of the present invention.

Embodiments of the present invention are directed to delay circuits that generate a delay equal to a percentage of the input pulse width of a clock. For example, if it was desired to have an input pulse width of 1 nanosecond (ns) and another signal that is generated 0.5 ns after the 1 ns pulse, then the delay circuits of the embodiments of the present invention as described below can generate an output that is 0.5 ns delayed from the input pulse. Embodiments of the present invention generate a delay equal to a percentage of the input pulse width of a clock by learning the timing of the input pulse, playing back the timing at a certain percentage thereof, and going back to a restore state to start the learning and playing back over again. The delay circuits in the embodiments of the present invention each use a timing capacitor to facilitate performing these operations. In particular, learning the timing of the input pulse is brought about by discharging the timing capacitor from the restore voltage, playing back the timing at a certain percentage thereof is brought about by charging up the timing capacitor until the output stage switches, and going back to a restore state to start the learning and playing back over again is brought about by pre-charging the timing capacitor to the restore state. Essentially, obtaining a delay that is equal to a percentage of the input pulse width of a clock is brought about by changing the ratio of the discharge current and charge-up current of the timing capacitor. For example, if the timing capacitor was charged-up at a rate that was twice as fast as it took to discharge the capacitor from the restore voltage, then it would take x time to discharge the capacitor and 0.5x time to charge-up the capacitor back to the restore voltage where the output stage will switch. Changing the ratio of the discharge current and charge-up current of the timing capacitor enables the delay circuits of the various embodiments of the present invention to generate an output pulse that is almost any percentage of the input pulse. Those skilled in the art will recognize that the amount of percentage will have a limitation that the delay represented in the output pulse cannot exceed the cycle time. That is, there is a limitation that the output stage switch and restore before the next pulse is issued to the timing circuit.

Although the following embodiments of the present invention are directed to a delay circuit used in the timing of a word line (WL) of a storage cell in a dynamic random access memory (DRAM) array, those skilled in the art will recognize that the various delay circuits described herein are suitable for timing circuit operations in a wide range of applications such as static random access memories (SRAMs) and input/output circuits (I/O's). Thus, embodiments of the present invention are not limited to any one particular timing application and are actually suitable for use in the timing of any event that needs to be timed relative to another event's duration.

FIG. 1 shows an example of one timing diagram 100 used to control timing of a WL used with a storage cell in a DRAM array of storage cells according to one embodiment of the present invention. In one clock cycle, a typical DRAM needs to use the WL to perform a write or read operation to the array of storage cells. As shown in FIG. 1, these operations are performed with a WL pulse that has a pulse width that is high for three quarters of the cycle and low for one quarter of the cycle. In addition to showing the WL pulse, FIG. 1 shows the equalization (EQ) and set (SET) signals that are associated with the WL pulse. Those skilled in the art will recognize that this is only an example and that other DRAM architectures may have different timing requirements that may depend on the timing requirements of the signal development (i.e., Sig Dev), write back and restore pulses.

Nevertheless, referring back to the example shown in FIG. 1, generating an input clock to time a WL pulse that is high for three quarters of the cycle and low for one quarter of the cycle (i.e., a 75% duty clock) can be problematic to obtain from a typical input clock that operates at a 50% duty clock (i.e., pulse is high for one-half of the cycle and low for one-half of the cycle). Managing this issue becomes more pronounced as it becomes more desirable to speed up performance of the DRAM. One way to manage the issue of generating a 75% duty clock from a 50% input clock is by using a phase-locked loop (PLL) device. Timing circuits that employ a PLL device are typically very large, occupy a large amount of space on an integrated circuit chip and are expensive. Therefore, it would be desirable to generate a timing circuit that can accept a 50% input clock and generate a duty clock therefrom that is a certain percentage of the input clock (e.g., 60%, 70%, 75%, 80%, etc.) without having to use a PLL device or other large and expensive devices such as a delay-locked-loop (DLL) device. In addition to generating the correct timing off a 50% input clock, it would be desirable to ensure that such a timing circuit is not affected by process variation or applied conditions such as voltage, or temperature (P-V-T variation). It is also desirable that this timing function across a range of input clock cycle times while maintaining the same percentage of the input pulse width. This way, as cycle time is slowed, both the high and low durations of the output are increased, adding timing margin to all phases of circuit operation using this output.

Figure 2:
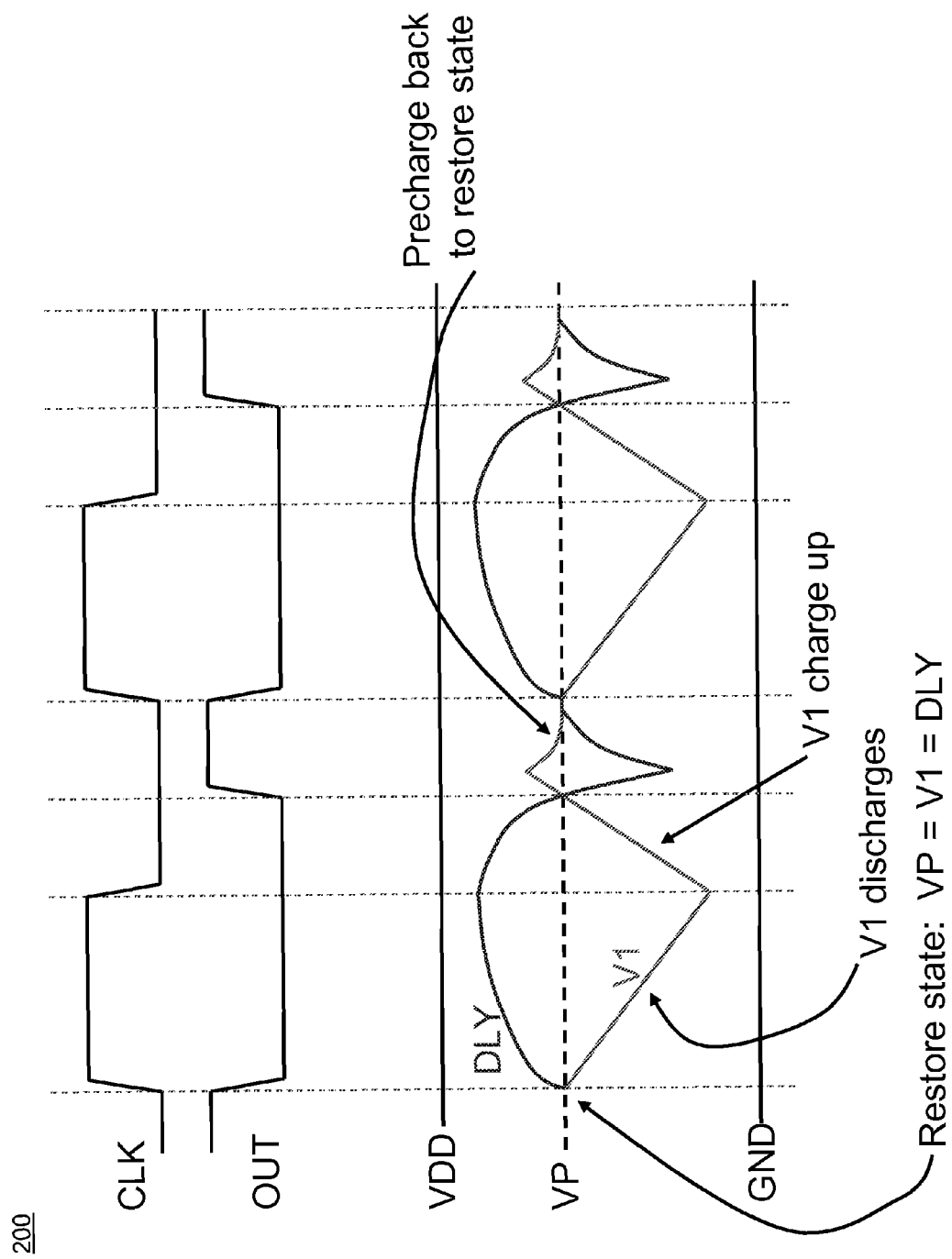
FIG. 2 shows a circuit timing diagram used to control timing of a delay circuit according to one embodiment of the present invention.
Figure 3:
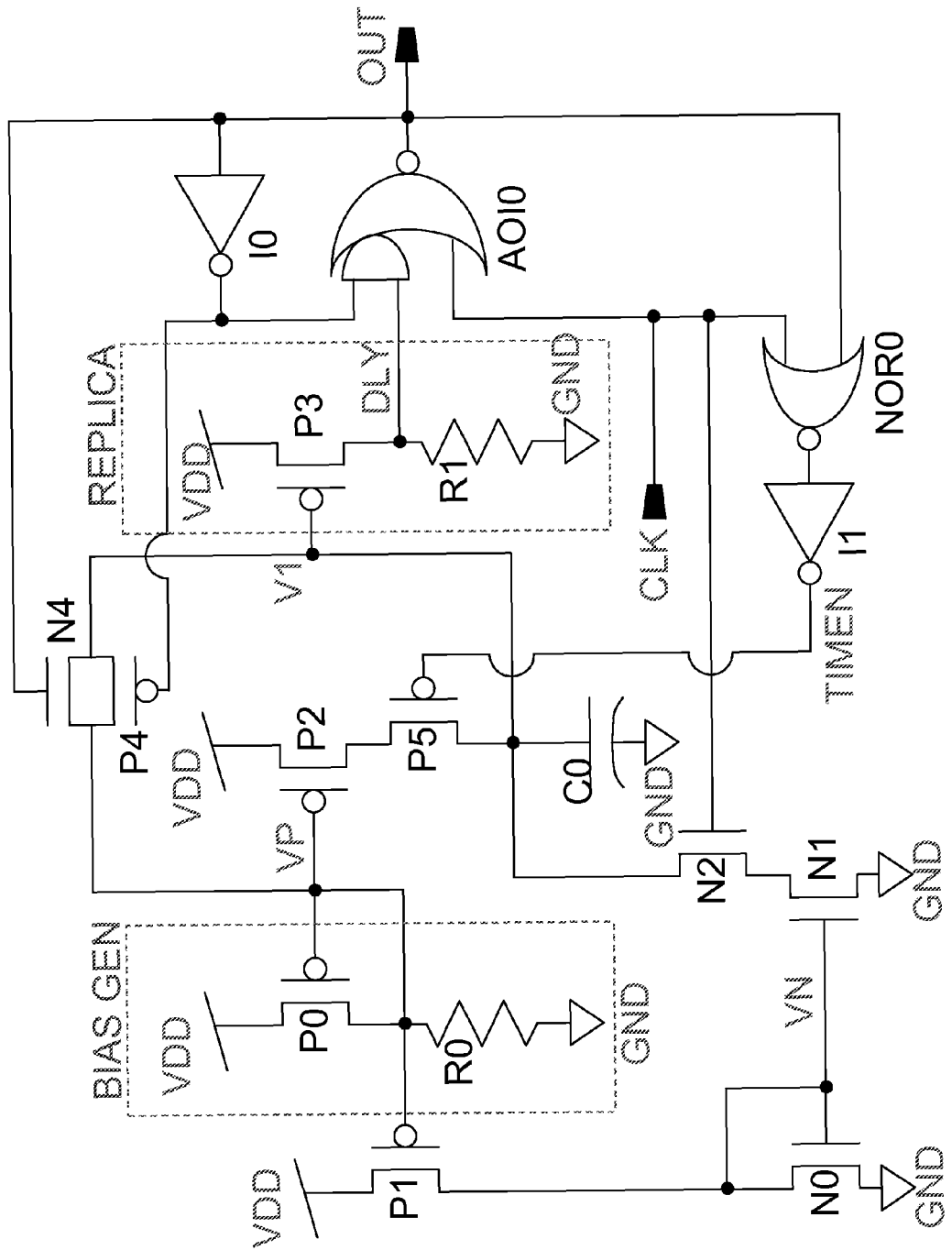
FIG. 3 shows a delay circuit according to a first embodiment of the present invention.
Figure 4:
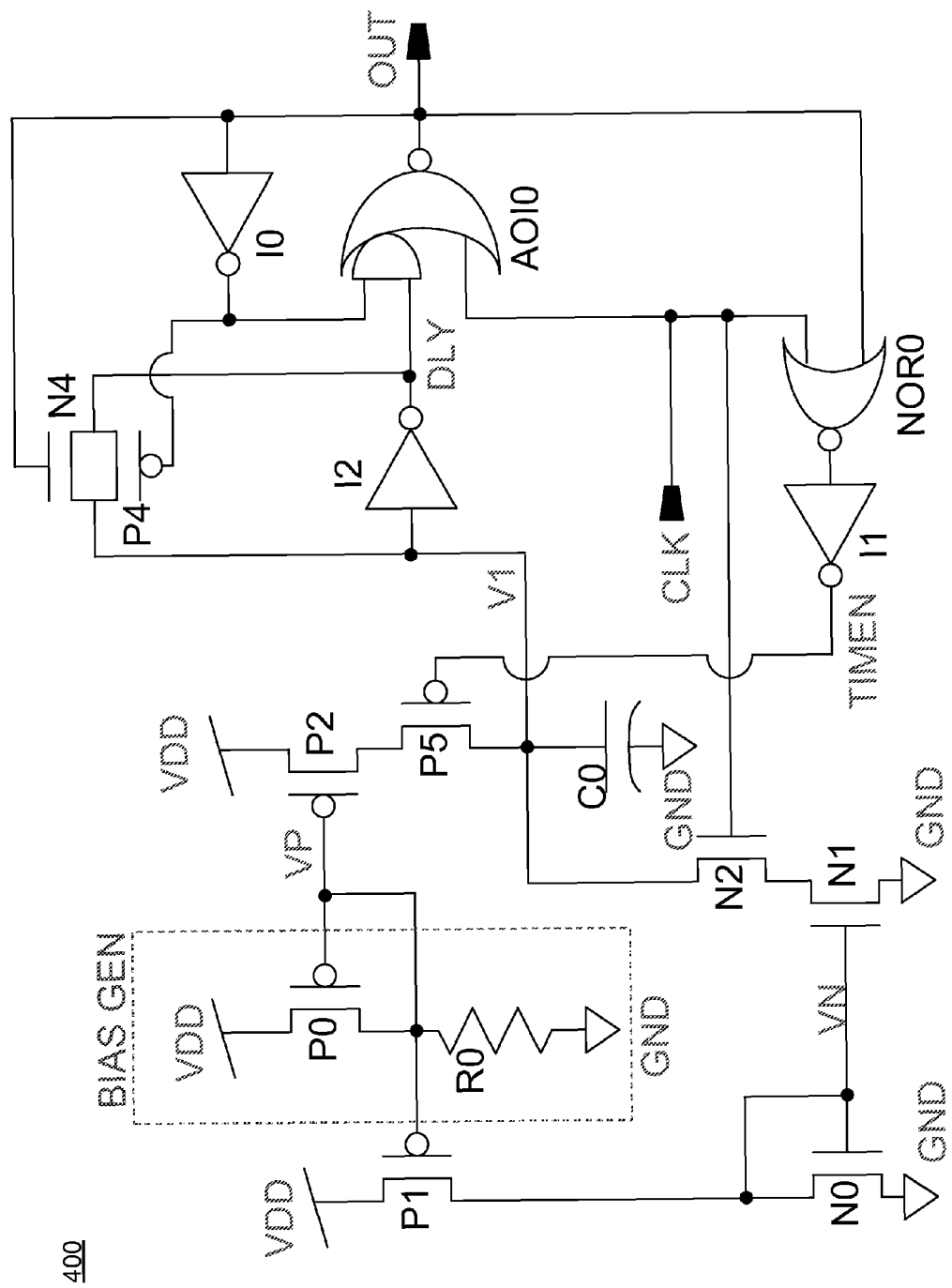
FIG. 4 shows a delay circuit according to a second embodiment of the present invention.
Figure 5:
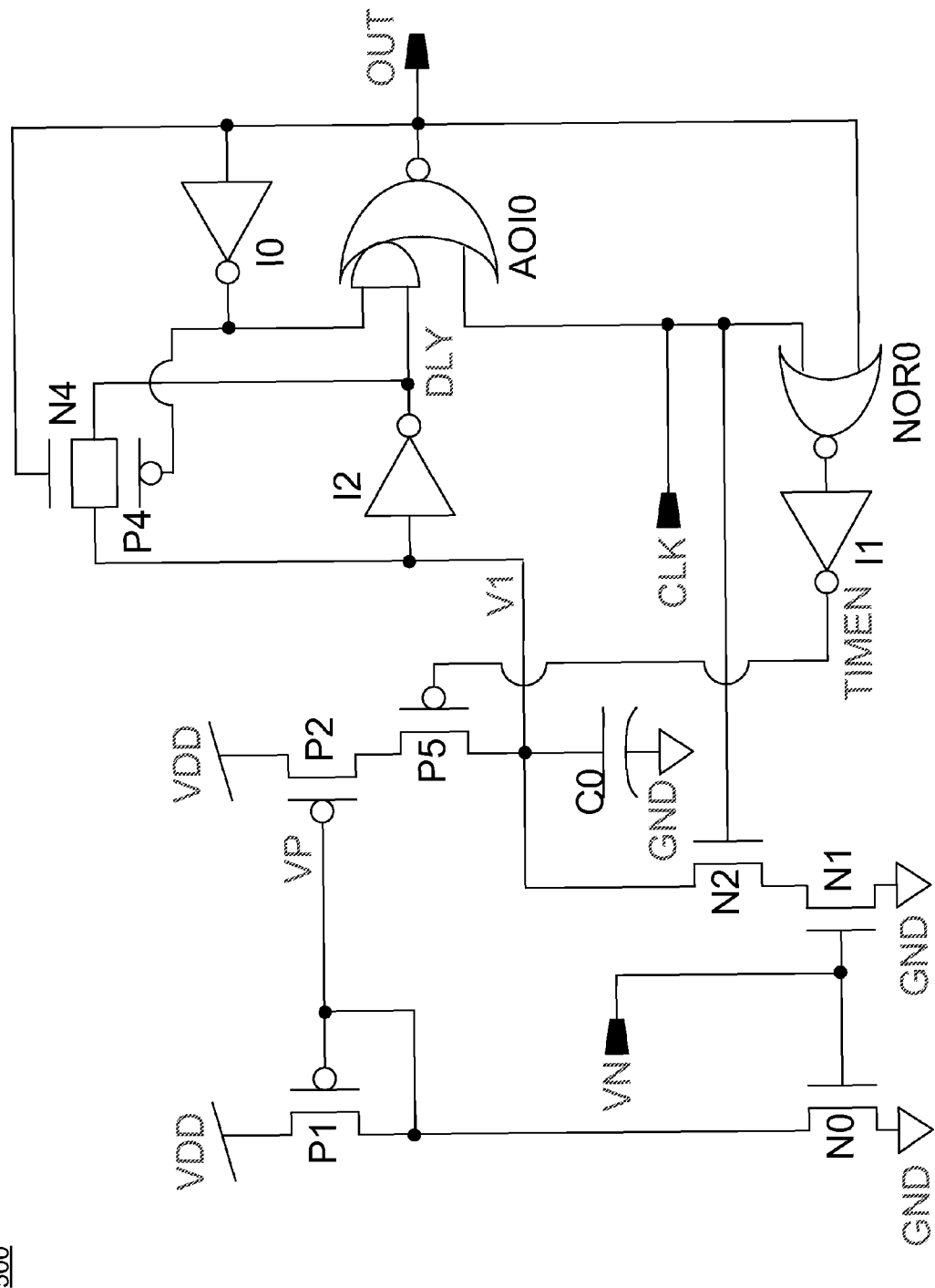
FIG. 5 shows a delay circuit according to a third embodiment of the present invention.

FIG. 2 shows a circuit timing diagram 200 used to control timing of delay circuits illustrated in FIGS. 3-5 of the present invention. In FIG. 2, the input clock CLK is high for one-half of the cycle and low for the other half of the cycle, while the output clock OUT is low for three-quarters of the cycle and high for one quarter of the cycle. As will be explained below, the delay circuits illustrated in the embodiments of FIGS. 3-5 will invert this output so that OUT actually generates a duty cycle that is high for three-quarters of the cycle and low for one quarter of the cycle (i.e., 75% high and 25% low). Below the input clock CLK and output clock OUT signals are the voltages of certain elements in the delay circuits illustrated in the embodiments of FIGS. 3-5 that enable the circuits to generate output clock OUT with such a duty cycle that is delayed with respect to input clock CLK.

As shown in FIG. 2, when the output clock OUT is at the point where there is a transition from one logic state to another, the delay circuits illustrated in the embodiments of FIGS. 3-5 are at a state or phase referred to as a restore state because a voltage reference VP equals the voltage V1 of a timing capacitor C0 (see FIGS. 3-5) which equals the voltage DLY, which is the voltage of a node used in the circuits to facilitate operation of the restore, discharge and charge-up states. The voltage reference VP has a value that is somewhere in between supply voltage VDD and ground GND. The voltage at this restore state is referred to as the trip point because this is the threshold point where the output clock OUT can transition from one logic state to another logic state. In particular, any voltage above this point will result in one logic state, while a voltage below this point will result in the opposite logic state. Essentially, the trip point is the meta-stable point of the delay circuits illustrated in the embodiments of FIGS. 3-5. Note that details of input clock CLK, output clock OUT, voltage reference VP, voltage V1, voltage DLY, timing capacitor C0, supply voltage VDD and ground GND are explained below with more detail in the descriptions set forth for each individual delay circuit illustrated in FIGS. 3-5.

Referring back to FIG. 2, as the input clock CLK goes high, timing capacitor C0 is discharged resulting in the reduction of voltage V1 towards ground GND and the increase of voltage DLY. The reduction of voltage V1 and increase of voltage DLY continues for the entire duration that the input clock CLK pulse is high. During this discharge phase, the timing of the input pulse is being learned. As will be shown below with reference to the delay circuits illustrated in FIGS. 3-5, a constant current source is integrated across the timing capacitor for the duration that the input clock CLK is high. This stores voltage V1 on timing capacitor C0 and is dependent upon input clock CLK. Thus, the duration of the input clock CLK pulse width is represented as the voltage V1 on the timing capacitor C0.

Once the input clock CLK goes from high to low, timing capacitor C0 begins to charge up resulting in the increase of voltage V1 and decrease of voltage DLY. During this charge-up phase, the timing of the input clock CLK as generated in the discharge phase is being played back at a certain percentage thereof. As shown in FIG. 2, the play-back or charge-up of voltage V1 is at a rate that is twice as fast as the rate at which it was discharged (i.e., voltage V1 charges up to reference voltage VP in half the time it took to get down from there). This corresponds to a 50% play back of the input clock.

Eventually, voltage V1 charges up and voltage DLY decreases such that both cross reference voltage VP (i.e., VP equals V1 equals DLY). As mentioned above, this is the trip point and the output clock OUT is at a transition going from low to high. This transition on output clock OUT causes the timing circuit to enter the restore state since the delay playback is complete.

Voltage V1 continues moving above reference voltage VP causing the timing capacitor C0 to charge up towards voltage supply VDD and voltage DLY continues moving below voltage VP towards ground GND, which both results in the output clock OUT moving towards high. When output clock OUT goes high, the restore state is entered and voltage V1 starts to move down towards voltage reference VP and voltage DLY starts to move up towards voltage reference VP. Essentially, this phase is precharging the timing capacitor C0 and getting it ready for the next pulse of the input clock CLK. By the time that input clock CLK goes high, voltage V1 and voltage DLY are at voltage reference VP and the operation is in the restore state (voltage VP=voltage V1=voltage DLY) ready for the next cycle. As will be explained below, this state makes the delay circuits illustrated in FIGS. 3-5 substantially insensitive to P-V-T variation because the circuit always starts from the trip point, removing output delay variation due to trip point variation. The circuit delay will have some sensitivity to the delay through the output stage logic and is therefore substantially, but not entirely, insensitive to P-V-T variation. It should be noted that the delay through the output stage logic is typically a small percentage of the delay generated by the timing capacitor and does significantly affect the overall circuit timing, but because it is a small percentage of the total delay, the circuits are substantially insensitive to P-V-T variation. Note that the absolute value of the trip point (voltage VP) will vary with P-V-T, but since the circuit is restored to this voltage, this does not affect the output delay.

After being in the restore state, the input clock CLK goes from low to high, causing output clock OUT to go from high to low. This results in timing capacitor C0 being discharged (i.e., reduction of voltage V1 towards ground GND) and an increase of voltage DLY towards voltage supply VDD. After discharging the timing capacitor the timing follows the same path as described above—charge-up and precharge back to the restore state to begin the next cycle.

The delay of the output clock OUT with respect to the input clock CLK can be set to a desired amount by adjusting the ratio of the currents used to discharge and charge-up the timing capacitor. In particular, changing the rate at which timing capacitor C0 charges to voltage V1 leads to a change in the slope of the lines in FIG. 2 that relate to a charge up of V1, while changing the rate at which timing capacitor C0 discharges towards voltage reference VP leads to a change in the slope of the lines in FIG. 2 that relate to the discharge of voltage V1. For example, charging voltage V1 faster causes the output clock OUT to reach the trip point faster, while charging voltage V1 slower causes the output clock OUT to reach the trip point slower. Adjusting the ratio of the currents used to discharge and charge-up the timing capacitor enables the delay circuits illustrated in the embodiments of FIGS. 3-5 to generate a duty clock that is a desired percentage (e.g., 60%, 70%, 75%, 80%, etc.) of a given input clock.

A benefit of using the ratio of the discharge current to charge-up current to generate a duty clock that is a certain percentage of the input clock is that the absolute values of the currents are not critical. For instance, if the discharge current and charge-up current has a two to one ratio, then the delay circuit 300 will work properly even if the currents go up or down by 20%. Thus, in the embodiments of the present invention, only the relative values of the discharge and charge-up currents are of importance; not the absolute values. This feature is also critical for the embodiments of the present invention being substantially insensitive to P-V-T variation. In semiconductors, it is feasible to design current sources with excellent matching (known ratios), but difficult to design current sources with fixed output current that does not vary (known absolute value). As will be apparent to those skilled in the art, the absolute values must be such that proper saturation margin is maintained on the devices configured as current sources.

As will be apparent to those skilled in the art, a delay circuit that has this type of timing allows for the circuit to be used on the very first input clock pulse coming into the circuit. This is not the case with delay circuits that utilize a PLL device or a DLL device. Such PLL or DLL based delay circuits take hundreds to thousands of input clock pulses to train with before it can be used to generate the desired output clock. This differentiation allows for much easier integration of embodiments of the present invention into semiconductor timing paths.

FIG. 3 shows a delay circuit 300 according to a first embodiment of the present invention. As shown in FIG. 3, delay circuit 300 comprises a bias generator BIAS GEN that includes a P-type field effect transistor (PFET) P0 over a resistor R0. Voltage reference VP allows PFET P0 to regulate current into resistor R0 at a steady state condition. The voltage VP is determined by the ratio of the transconductance of PFET P0 and the resistance of resistor R0. Transconductance is defined as the ratio of the device output current (drain current) to the voltage of the input (gate voltage) and is written as $g_m$. Voltage VP will settle to a voltage where the drain current of PFET P0 is equal to the current being conducted through resistor R0. That is, if voltage reference VP is too positive then PFET P0 will generate less current than what resistor R0 wants to consume, and if voltage reference VP is too negative then PFET P0 will generate more current than what resistor R0 wants to consume.

Referring back to FIG. 3, voltage reference VP is supplied to the gate of PFET P2. This configures PFET P2 into a current source which is referred to herein as a pull-up current source because it generates a charge-up current that is the same as (or mirrored to) the current generated by PFET P0. This is accomplished by matching the $g_m$ of PFET P2 and PFET P0. As will be apparent to those skilled in the art, the $g_m$ of PFET P2 could be increased or decreased relative to that of PFET P0 to increase or decrease the charge-up current. The charge-up current charges up the timing capacitor C0 via PFET P5. In particular, PFET P5 acts as a switching device and permits the charge-up current to pass through to charge-up timing capacitor C0. That is, if PFET P5 is on, then PFET P2 will charge up timing capacitor C0 using the generated charge-up current. On the other hand, if PFET P5 is off, then PFET P2 will not charge up the timing capacitor C0. Below is a more detailed explanation on how PFET P5 is synchronized to gate the charge-up current onto the timing capacitor C0.

In order to generate the discharge current used to discharge timing capacitor C0, voltage reference VP is also supplied to PFET P1. In order to attain a 75% duty cycle clock from a 50% input clock per the aforementioned DRAM embodiment, PFET P1 generates a current that is half the current generated from PFET P0. In this embodiment, PFET P1 is made half the channel width or half the $g_m$ of PFET P0 and PFET P2 in order to generate a current that is half the current generated by PFET P0 and PFET P2. A current that is half the current generated by PFET P0 and PFET P2 will result in the charge-up current of the timing capacitor C0 being twice that of the discharge current of the capacitor. As will be apparent to those skilled in the art, there are multiple device $g_m$'s that can be adjusted to make the charge-up current a specific ratio to the discharge current. In this embodiment, the ratio of PFET P1 to PFET P2 and PFET P0 is used.

Applying voltage reference VP to PFET P1 results in a current being supplied to N-type field effect transistor (NFET) N0. Like PFET P0 and resistor R0, a voltage VN is formed that is forced to find a steady-state voltage level at NFET N0 that will support the same current supplied from PFET P0. This creates a voltage VN that can be used to bias NFET devices which will generate a current that is a specific ratio to the charge-up current generated from PFET P2 and P0.

As shown in FIG. 3, voltage VN is supplied to the gate of NFET N1. This configures NFET N1 as a current source which is referred to herein as a pull-down current source because it generates a discharge current that is the same as the current generated by NFET P0. This is accomplished by making the $g_m$ of device NFET N1 the same as NFET N0 (same channel width, length and device type). As will be apparent to those skilled in the art, other $g_m$ ratios could be used to generate specific discharge and charge-up current ratios. Embodiments of the present invention are not limited to any one set of $g_m$ ratios for devices P0, P1, P2, N0 and N1.

The discharge current discharges the timing capacitor C0 via NFET N2. Like PFET P5, NFET N2 acts as a switching device and permits the discharge current to pass therethrough to discharge timing capacitor C0. That is, if NFET N2 is on, then NFET N1 will discharge timing capacitor C0 using the generated discharge current. On the other hand, if NFET N2 is off, then NFET N1 will not discharge the timing capacitor C0. Below is a more detailed explanation on how NFET N1 and NFET N2 are synchronized to gate the discharge current from the timing capacitor C0.

Adjusting the ratio of the discharge and charge-up currents used to discharge and charge the timing capacitor C0 enables the delay circuit 300 to generate a duty clock that is almost any desired percentage (e.g., 60%, 70%, 75%, 80%, etc.) of a given input clock, so long as the output clock OUT switches prior to the next clock cycle of input clock CLK. As mentioned above, changing the sizes of PFETS P0, P1 and P2 and NFETS N0 and N1 allows one to train delay circuit 300 to generate a duty clock with that desired percentage. In the DRAM embodiment described herein, PFET P1 is made half the size of PFET P0, so that the discharge current generated from NFET N1 is half the charge-up current generated from PFET P2.

The description heretofore of the left-hand side of FIG. 3 (i.e., left of and including the pull-up current source and pull-down current source) relates to generating a specified ratio of the discharge current to the charge-up current for the timing capacitor C0 that will result in an output clock that is a desired percentage of an input clock. The right-hand side of FIG. 3 (i.e., to the right of the pull-up current source and pull-down current source) relates to the aspect of the delay circuit 300 that controls the discharge, charge-up and restore phases of operation. The below description of the right-hand side of FIG. 3 follows the timing illustrated in the timing diagram 200 of FIG. 2.

As mentioned above, when in the restore state the input clock CLK is low and the output clock OUT is at the trip point (i.e., the threshold point where OUT transitions from one logic state to another logic state). In order to obtain this restore state in FIG. 3, a pass gate formed from PFET P4 and NFET N4 is turned on when the output clock OUT is high. Note that when the output clock OUT is high (as provided by an AND-OR-Invert AOI0 that is a NOR gate with a two input AND gate as one input and the input clock CLK as the other input), inverter I0 inverts that to a low which turns on PFET P4 and the high output inputted to NFET N4 turns on that transistor, both resulting in the pass gate to be on. When the pass gate is turned on, a replica (REPLICA) of the bias generator BIAS GEN is shorted to voltage VP so that voltage V1 equals voltage DLY. As shown in FIG. 3, the REPLICA includes PFET P3 over resistor R1, wherein PFET P3 and resistor R1 are the exact same as PFET P0 and resistor R0 in the bias generator BIAS GEN. Note that VP will equal voltage V1 and voltage DLY because PFET P0 and resistor R0 are the exact same as PFET P3 and resistor R1. Because at this point in the timing diagram the input clock CLK is low, NFET N2 will be off and PFET P5 will be off because NOR gate NOR0 and inverter I1 form an OR gate that generates a high in the restore state causing TIMEN to keep PFET P5 off.

In the discharge state, the input clock CLK goes high and timing capacitor C0 is discharged resulting in the reduction of voltage V1 towards ground GND and increase of voltage DLY. The reduction of voltage V1 and increase of voltage DLY continues for the entire duration that the input clock CLK pulse is high. In addition, in this discharge state that the input clock CLK is high, the output clock OUT is low. In order to obtain this discharge state in FIG. 3, NFET N2 is turned on when input clock CLK is high allowing NFET N1 to generate a discharge current that is supplied to timing capacitor C0 which facilitates discharge of the capacitor. Simultaneously, when input CLK is high and output clock OUT is low, PFET P5 is turned off because TIMEN is high as provided by NOR gate NOR0 and inverter I1. Voltage DLY increases because when output clock OUT is low, the pass gate of NFET N4 and PFET P4 is off and the short of bias generator BIAS GEN to voltage VP is removed. Thus, voltage DLY increases towards supply voltage VDD because when voltage V1 is low, replica (REPLICA) is turned on which generates a higher voltage DLY level, increasing it towards supply voltage VDD.

Once the input clock CLK goes from high to low, timing capacitor C0 begins to charge up resulting in the increase of voltage V1 and the decrease of voltage DLY. In particular, when input clock CLK goes low, NFET N2 is turned off disabling NFET N1 to generate a discharge current that is supplied to timing capacitor C0. An input clock CLK that is low while output clock OUT is low results in PFET P5 turning on because TIMEN is low as provided by NOR gate NOR0 and inverter I1. When PFET P5 is turned on a charge-up current generated from PFET P2 is supplied to timing capacitor C0 which facilitates the charge-up of the capacitor. As mentioned before, timing capacitor C0 will charge-up at a rate that corresponds to the current generated from PFET P2. Simultaneously, while timing capacitor C0 is charging, voltage DLY decreases because when voltage V1 is high, replica (REPLICA) is turned off which generates a lower voltage DLY level, decreasing it towards ground GND.

Eventually, voltage V1 charges up and voltage DLY decreases such that both meet at the trip point where reference voltage VP equals voltage V1 which equals voltage DLY). At this point in the circuit diagram input clock CLK is still low and the output clock OUT is transitioning from low to high. Because input clock CLK is low and output clock OUT is low at this trip point, TIMEN is low which keeps PFET P5 on so that PFET P2 continues to charge up timing capacitor C0 which increases voltage V1. While timing capacitor C0 is charging, voltage DLY continues decreasing because the replica (REPLICA) is turned off due to an increasing voltage V1. Hence, there is a lower voltage DLY.

When the output clock OUT does actually switch to high while the input clock CLK is low, voltage V1 starts to move down towards voltage reference VP and voltage DLY starts to move up towards voltage reference VP. As mentioned before, this is the phase operation where the delay circuit is precharging the timing capacitor C0 and getting it ready for the next pulse of the input clock CLK. In this phase operation, the decrease of voltage V1 is brought about because when input clock CLK is low and output clock OUT is high, this results in NOR gate NOR0 and inverter I1 generating a TIMEN that is high which closes PFET P5 and prevents PFET from further generating charge-up current that charges up timing capacitor C0. A low input clock CLK also keeps NFET N2 off which prevents NFET N1 generating a discharge current that will discharge timing capacitor C0. Because output clock OUT is high and input clock CLK is low, the pass gate formed from NFET N4 and PFET P4 is turned on causing the replica (REPLICA) to short to voltage VP, which results in the precharging of the timing capacitor C0 voltage to the restore state. This makes the circuit 300 ready for the next cycle and completes the operation from the current cycle.

FIG. 4 shows a delay circuit 400 according to a second embodiment of the present invention. In this embodiment, delay circuit 400 has removed the replica (REPLICA) of the bias generator BIAS GEN and replaced it with an inverter I2. Rather than shorting the replica (REPLICA) to voltage VP in the restore state as in the embodiment shown in FIG. 3, the inverter I2 in the embodiment of FIG. 4 is shorted to itself when the pass gate formed from NFET N4 and PFET P4 is turned on. Shorting inverter I2 to itself (i.e., tying the input of inverter I2 to its output) forces the device to sit at its trip-point or meta-stable point; essentially this is a reset of that device. In this state, the pass gate formed from PFET P4 and NFET N4 and inverter I2 form a shunt device. Thus, when the output clock OUT from delay circuit 400 is at the trip point, substantially all P-V-T variation from the circuit due to trip point variation is removed. Furthermore, because at this point in the timing diagram (i.e., in the restore state), when the input clock CLK is low, NFET N2 will be off and PFET P5 will be off. This results in voltage V1 equaling voltage DLY in the restore state in this embodiment. Note that in this embodiment in the restore state, voltage VP does not equal voltage V1 and voltage DLY since inverter I2 is not a replica of the bias generator BIAS GEN.

The delay circuit 400 is essentially the same as the delay circuit 300 in FIG. 3, except for the use of the inverter I2 in place of the REPLICA. The operation of the inverter I2 during the restore state has been explained and the operation of the inverter in the other phases of operation (i.e., the discharge state and charge-up state) is essentially the same as previously described for the embodiment with the REPLICA. Because this embodiment is controlled in the same manner as shown in the timing diagram 200 depicted in FIG. 2, a separate description describing the full operation of this circuit is not provided because its operation would be readily apparent to those skilled in the art in light of the description for the embodiment illustrated in FIG. 3.

FIG. 5 shows a delay circuit 500 according to a third embodiment of the present invention. In this embodiment, delay circuit 500 is similar to delay circuit 300 depicted in FIG. 4, except that delay circuit 500 has removed the bias generator BIAS GEN and added an external voltage source VN to generate voltage VN to supply to pull-down current source NFET N1. In this embodiment, the ratio of the discharge and charge-up currents is controlled by PFETs P1 and P2. With the removal of the bias generator BIAS GEN and the addition of the external voltage source VN, operation of the delay circuit 500 is similar to the delay circuit 300 depicted in FIG. 4. Because delay circuit 500 is controlled in the same manner as shown in the timing diagram 200 depicted in FIG. 2, a separate description describing the full operation of this embodiment is not provided because its operation would be readily apparent to those skilled in the art.

The delay circuits described in the embodiments of FIGS. 3-5 track to an input pulse width of the input clock CLK. In this configuration, to generate an output clock OUT at a specific phase of input clock cycle CLK requires a known duty cycle for input clock CLK. For example, the 75% output depends on a known 50% duty input for the embodiments of FIGS. 3-5. Alternatively, it may be desirable to have an output clock OUT that tracks to the cycle time of input clock CLK without any dependence on the input clock duty cycle.

Figure 6:
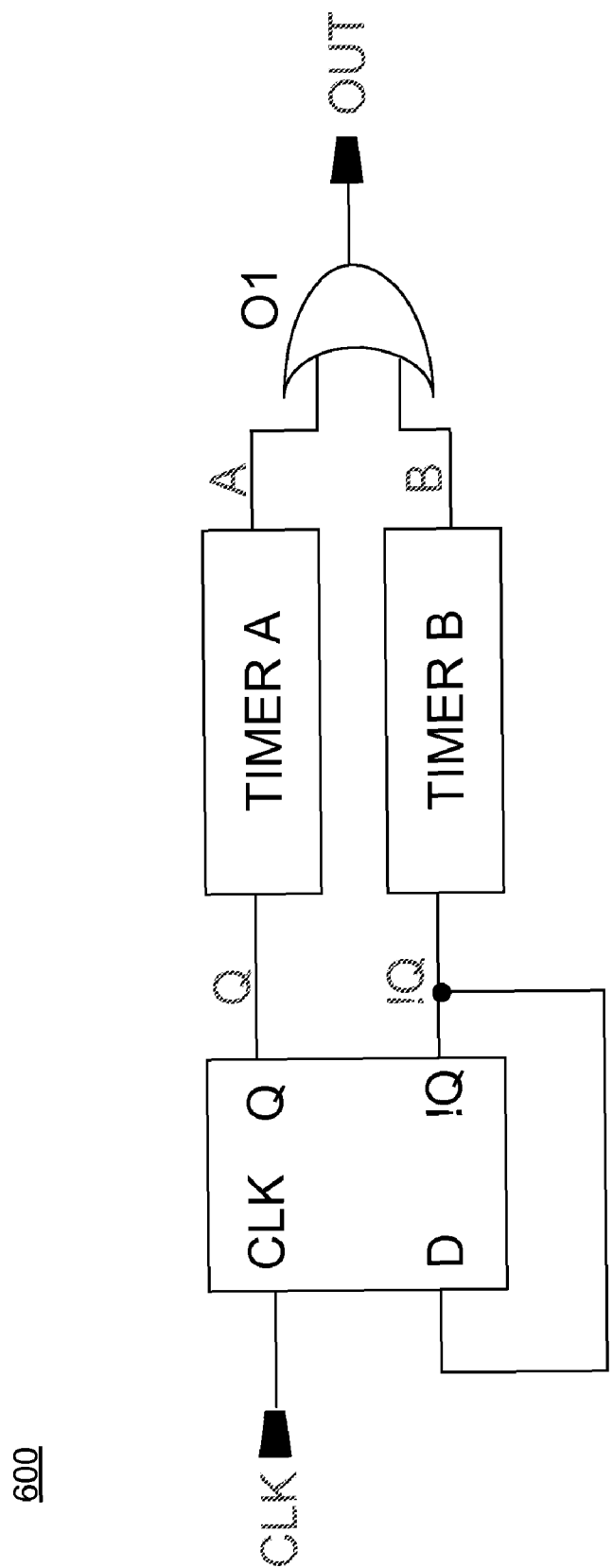
FIG. 6 shows a full cycle tracking device configured to facilitate tracking of the circuits depicted in FIGS. 3-5.

FIG. 6 shows a full cycle tracking device 600 configured to facilitate tracking of the circuits depicted in FIGS. 3-5 to the full cycle time of the input clock CLK without regard to the input CLK duty factor (ratio of high to low time). As shown in FIG. 6, the full cycle tracking device 600 includes a toggle flip-flop that in this embodiment is a D flip-flop. Inputs of the D flip-flop is the input clock CLK and the feedback of one of its two outputs; true output Q and complement output !Q. In this embodiment, complement output !Q is the D input of the flip-flop. True output Q and complement output !Q are inputted into Timer A and Timer B, respectively. In this way, the cycle time of input clock CLK is converted to a pulse width by the toggle flip-flop. Half of the cycles are represented by the high pulse on output Q and the other half are represented by the high pulse on output !Q. In one embodiment, Timer A and Timer B are two copies of one of the delay circuits described in the embodiments of FIGS. 3-5. The outputs from Timer A and Timer B, A and B, respectively, are inputted to an OR gate O1. The output from the OR gate O1 generates the output clock OUT that is tracked to the cycle of the input clock CLK. In this way, a single instance of the circuit in the embodiments of FIGS. 3-5 can be used to track an input pulse width and two instances of the circuit in the embodiments of FIGS. 3-5 can be used to track an input cycle time when configured as shown in FIG. 6.

Figure 7:
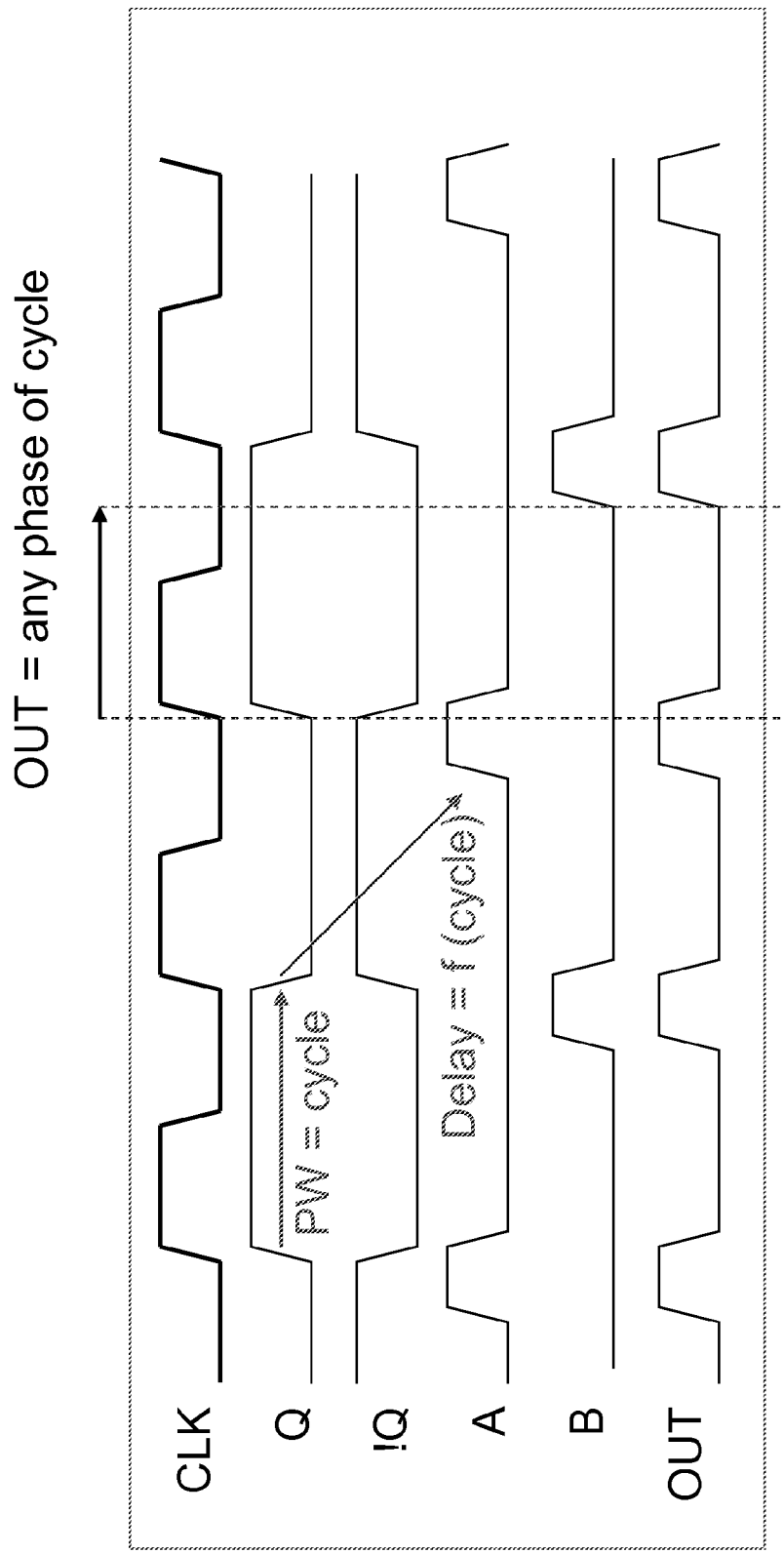
FIG. 7 shows a timing diagram illustrating operation of the full cycle tracking device depicted in FIG. 6.

FIG. 7 shows a timing diagram 700 illustrating operation of how the full cycle tracking device 600 depicted in FIG. 6 can generate an output at any phase of the cycle of the input clock CLK. As shown in FIG. 7, output Q from the flip-flop is high for the first cycle of input clock CLK, low for the second cycle, high for the third cycle and low for the fourth cycle. In contrast, output !Q from the flip-flop is low for the first cycle of input clock CLK, high for the second cycle, low for the third cycle and high for the fourth cycle. Timer A trains to a clock pulse represented by Q and generates an output A, while Timer B trains to a clock pulse represented by !Q and generates an output B. Delays A and B represent the even and odd cycles, respectively of the input clock CLK. Using the OR gate O1, enables the full cycle tracking device 600 to generate an output clock pulse that fires once per the cycle of the input clock CLK. As a result, the generated output clock pulse can be any phase of the cycle of the input clock CLK. This allows one to generate output clock OUT such that it is any percentage of the period of the input clock CLK as measured from one rising edge to another rising edge and not only a percentage of the percentage of the input clock CLK pulse width as measured from one rising edge to a falling edge. Thus, the delay circuits of the embodiments depicted in FIGS. 3-5 can track to the full cycle time of the input clock CLK without regard to its duty factor.

It is apparent that there has been provided with this disclosure a delay circuit with delay equal to a percentage of an input pulse width. While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the invention.

What is claimed is:

1. A circuit, comprising:
a timing capacitor;
a pull-down current source configured to generate a discharge current that discharges the timing capacitor;
a pull-up current source configured to generate a charge-up current that charges up the timing capacitor;
a clock configured to generate an input pulse having a first duty cycle that controls generation of the discharge current by the pull-down current source, generation of the charge-up current by the pull-up current source and precharge of the timing capacitor to a restore state; and
an output stage, coupled to the timing capacitor, configured to generate an output pulse with a second duty cycle that is an adjustable percentage of the first duty cycle of the input pulse generated by the clock, wherein the second duty cycle is a function of the ratio of the discharge current to the charge-up current.

2. The circuit according to claim 1, wherein the generated output pulse is substantially insensitive to process-voltage-temperature variation.

3. The circuit according to claim 2, wherein the output pulse from the second duty cycle is based on the relative values of the discharge and charge-up currents and is independent of any absolute values.

4. The circuit according to claim 1, further comprising a bias generator configured to generate a current that is mirrored to the pull-up current source.

5. The circuit according to claim 4, wherein a predetermined amount of the current is supplied by the pull-down current source.

6. The circuit according to claim 4, wherein the output stage comprises a replica of the bias generator configured to facilitate the discharge of the timing capacitor, charge-up of the timing capacitor and precharge of the timing capacitor to a restore state.

7. The circuit according to claim 1, further comprising an external current source configured to generate a current that is supplied to the pull-down current source to generate the discharge current that facilitates the discharge of the timing capacitor.

8. The circuit according to claim 1, further comprising a gated switching device configured to enable and disable the discharging and charging of the timing capacitor.

9. The circuit according to claim 1, wherein the output stage comprises a shunt-precharge device configured to precharge the timing capacitor towards the restore state.

10. The circuit according to claim 1, wherein the output stage comprises reset logic configured to facilitate generation of the discharge current by the pull-down current source, the charge-up current by the pull-up current source and precharge of the timing capacitor to the restore state.

11. The circuit according to claim 1, further comprising a full cycle tracking device configured to facilitate tracking of the output pulse to the period of the input pulse.

12. The circuit according to claim 11, wherein the tracking device comprises a toggle flip-flop having an input configured to receive the input pulse and a first output coupled to a first timer and a second output coupled to a second timer, and logic configured to generate the output pulse that tracks to the period of the input pulse.

13. A delay circuit, comprising:
a timing capacitor;
a pull-down current source configured to generate a discharge current that discharges up the timing capacitor;
a pull-up current source configured to generate a charge-up current that charges up the timing capacitor;
a bias generator configured to generate a current that is supplied to the pull-down current source and the pull-up current source;
a clock configured to generate an input pulse having a first duty cycle that controls generation of the discharge current by the pull-down current source to discharge the timing capacitor, generation of the charge-up current by the pull-up current source to charge-up the timing capacitor and precharge of the timing capacitor to a restore state; and
an output stage, coupled to the timing capacitor, configured to generate an output pulse with a second duty cycle that is an adjustable percentage of the first duty cycle of the input pulse generated by the clock, wherein the second duty cycle is a function of the ratio of the discharge current to the charge-up current.

14. The delay circuit according to claim 13, wherein the generated output pulse is substantially insensitive to process-voltage-temperature variation.

15. The delay circuit according to claim 13, further comprising a gated switching device configured to enable and disable the discharging and charging of the timing capacitor.

16. The delay circuit according to claim 13, wherein the output stage comprises a replica of the bias generator configured to facilitate the discharge of the timing capacitor, charge-up of the timing capacitor and precharge of the timing capacitor to a restore state.

17. The delay circuit according to claim 13, wherein the output stage comprises a shunt-precharge device configured to precharge the timing capacitor towards the restore state.

18. The delay circuit according to claim 13, wherein the output stage comprises reset logic configured to facilitate generation of the discharge current by the pull-down current source and the charge-up current by the pull-up current source and precharge of the timing capacitor to the restore state.

19. The delay circuit according to claim 13, further comprising a full cycle tracking device configured to facilitate full tracking of the output pulse to the period of the input pulse.

20. A method for generating a clock signal, comprising:
generating an input pulse having a first duty cycle;
generating a discharge current that discharges a timing capacitor as the input pulse goes into one logic state;
generating a charge-up current that charges up the timing capacitor as the input pulse goes from the one logic state to the next logic state;
precharging the timing capacitor to a restore state for the next cycle of the input pulse; and
generating an output pulse in accordance with the input pulse as the timing capacitor discharges, charges-up and precharges, wherein the output pulse has a second duty cycle that is a percentage of the first duty cycle of the input pulse, wherein the second duty cycle is a function of the ratio of the discharge current to the charge-up current.

* * * * *